United States Patent
Do et al.

(10) Patent No.: US 8,164,184 B2
(45) Date of Patent: Apr. 24, 2012

(54) SEMICONDUCTOR DEVICE AND METHOD OF FORMING CONDUCTIVE PILLARS IN RECESSED REGION OF PERIPHERAL AREA AROUND THE DEVICE FOR ELECTRICAL INTERCONNECTION TO OTHER DEVICES

(75) Inventors: Byung Tai Do, Singapore (SG); Reza A. Pagaila, Singapore (SG); Linda Pei Ee Chua, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/832,821

(22) Filed: Jul. 8, 2010

(65) Prior Publication Data
US 2010/0270656 A1    Oct. 28, 2010

Related U.S. Application Data

(62) Division of application No. 12/331,682, filed on Dec. 10, 2008, now Pat. No. 7,776,655.

(51) Int. Cl.
*H01L 23/34* (2006.01)
(52) U.S. Cl. .. 257/723; 257/737; 257/780; 257/E23.021
(58) Field of Classification Search ............... 257/723, 257/737, 738, 780, 781, E23.021
See application file for complete search history.

(56) References Cited

U.S. PATENT DOCUMENTS

| | | | |
|---|---|---|---|
| 6,998,344 B2 | 2/2006 | Akram et al. | |
| 7,291,929 B2 | 11/2007 | Tanaka et al. | |
| 7,618,846 B1 | 11/2009 | Pagaila et al. | |
| 2007/0023886 A1 | 2/2007 | Hedler et al. | |
| 2008/0142945 A1 | 6/2008 | Ha et al. | |
| 2010/0140783 A1 * | 6/2010 | Do et al. ................ | 257/692 |

* cited by examiner

*Primary Examiner* — Hoai V Pham
(74) *Attorney, Agent, or Firm* — Robert D. Atkins; Patent Law Group: Atkins & Associates, P.C.

(57) ABSTRACT

A semiconductor wafer contains a plurality of semiconductor die each having a peripheral area around the die. A first insulating layer is formed over the die. A recessed region with angled sidewall is formed in the peripheral area. A first conductive layer is formed over the first insulating layer outside the recessed region and further into the recessed region. A conductive pillar is formed over the first conductive layer within the recessed region. A second insulating layer is formed over the first insulating layer, conductive pillar, and first conductive layer such that the conductive pillar is exposed from the second insulating layer. A dicing channel partially through the peripheral area. The semiconductor wafer undergoes backgrinding to the dicing channel to singulate the semiconductor wafer and separate the semiconductor die. The semiconductor die can be disposed in a semiconductor package with other components and electrically interconnected through the conductive pillar.

25 Claims, 10 Drawing Sheets

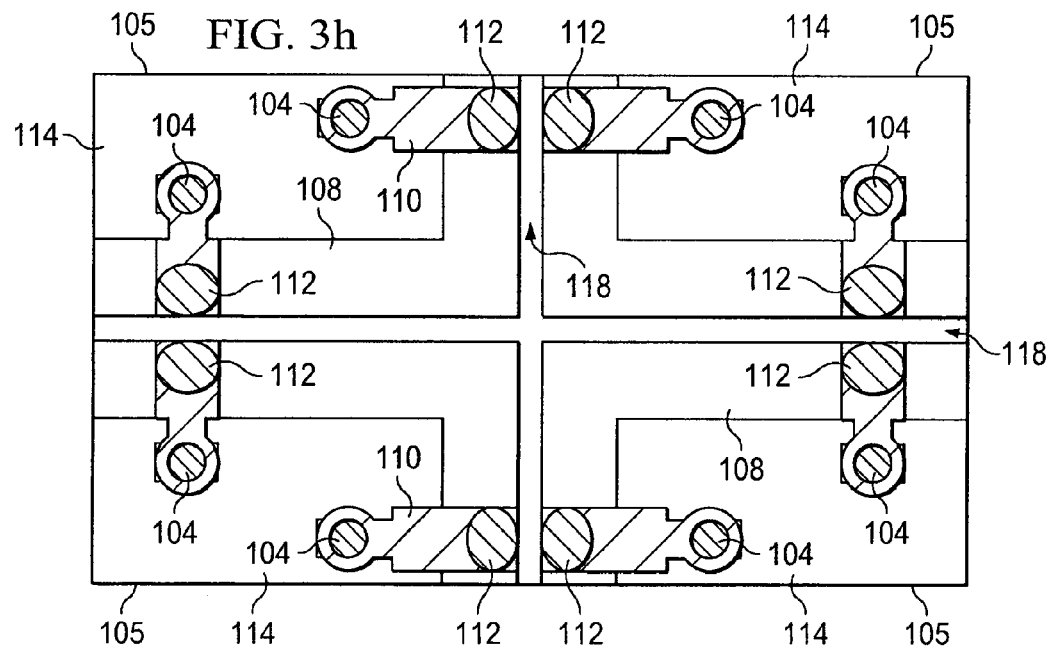
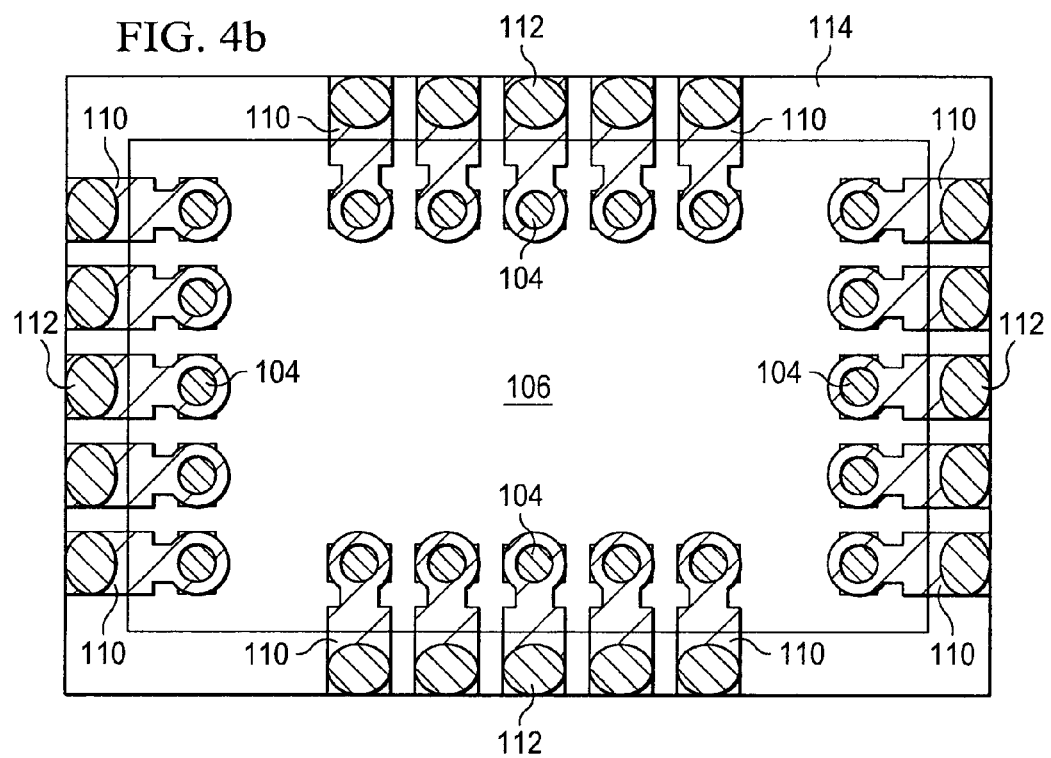

SEMICONDUCTOR DEVICE AND METHOD OF FORMING CONDUCTIVE PILLARS IN RECESSED REGION OF PERIPHERAL AREA AROUND THE DEVICE FOR ELECTRICAL INTERCONNECTION TO OTHER DEVICES

CLAIM TO DOMESTIC PRIORITY

The present application is a division of U.S. patent application Ser. No. 12/331,682, filed Dec. 10, 2008, and claims priority to the foregoing parent application pursuant to 35 U.S.C. §120.

FIELD OF THE INVENTION

The present invention relates in general to semiconductor devices and, more particularly, to a semiconductor device having conductive pillars formed in a recessed region of a peripheral area around the device for electrical interconnection to other devices.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In package-in-package (PiP) and package-on-package (PoP) arrangements, the vertical electrical interconnect between components is typically accomplished with conductive through silicon vias (THV). In most THVs, the sidewalls and bottom-side of the via are conformally plated with conductive materials to enhance adhesion. The THVs are then filled with another conductive material, for example, copper deposition by an electroplating process. The THV formation typically involves considerable time for the via filling, which reduces the unit-per-hour (UPH) production schedule. The equipment need for electroplating, e.g., plating bath, and sidewall passivation increases manufacturing cost. In addition, voids may be formed within the vias, which causes defects and reduces reliability of the device. THV can be a slow and costly approach to make vertical electrical interconnections in semiconductor packages.

SUMMARY OF THE INVENTION

A need exists to provide vertical electrical interconnect between components of a semiconductor package without forming conductive vias. Accordingly, in one embodiment, the present invention is a semiconductor device comprising a semiconductor wafer having a plurality of semiconductor die with a recessed region formed in a peripheral area around the semiconductor die. A first insulating layer is formed over the semiconductor die. A first conductive layer is formed over the first insulating layer outside the recessed region and further extending into the recessed region. The first conductive layer is electrically connected to a contact pad on the semiconductor die. A conductive pillar is formed over the first conductive layer within the recessed region. The conductive pillar extends above a portion of the first conductive layer outside the peripheral area. A second insulating layer is formed over the first insulating layer, conductive pillar, and first conductive layer such that the conductive pillar is exposed from the second insulating layer.

In another embodiment, the present invention is a semiconductor device comprising a semiconductor wafer having a plurality of semiconductor die with a recessed region formed in a peripheral area around the semiconductor die. A first insulating layer is formed over the semiconductor wafer. A first conductive layer is formed over the first insulating layer outside the recessed region and further extending into the recessed region. A conductive pillar is formed over the first conductive layer within the recessed region. A second insulating layer is formed over the conductive pillar and first conductive layer.

In another embodiment, the present invention is a semiconductor device comprising a semiconductor wafer having a plurality of semiconductor die with a peripheral area around the semiconductor die. A recessed region is formed in the peripheral area. A first conductive layer is formed in the recessed region. A conductive pillar is formed over the first conductive layer within the recessed region. An insulating layer is formed over the conductive pillar and first conductive layer. The semiconductor wafer is singulated through the peripheral area to separate the semiconductor die.

In another embodiment, the present invention is a semiconductor device comprising a semiconductor die having a recessed region formed in a peripheral area of the semiconductor die. A first conductive layer is formed in the recessed region. A conductive pillar is formed over the first conductive layer within the recessed region. An insulating layer is formed over the conductive pillar and first conductive layer.

BRIEF DESCRIPTION OF THE DRAWINGS

FIGS. 3a-3h illustrate a process of forming conductive pillars in a recessed region of a peripheral area around the die;

FIGS. 4a-4b illustrate the semiconductor device with conductive pillars formed in the recessed region of the peripheral area around the die;

DETAILED DESCRIPTION OF THE DRAWINGS

Figure 1:
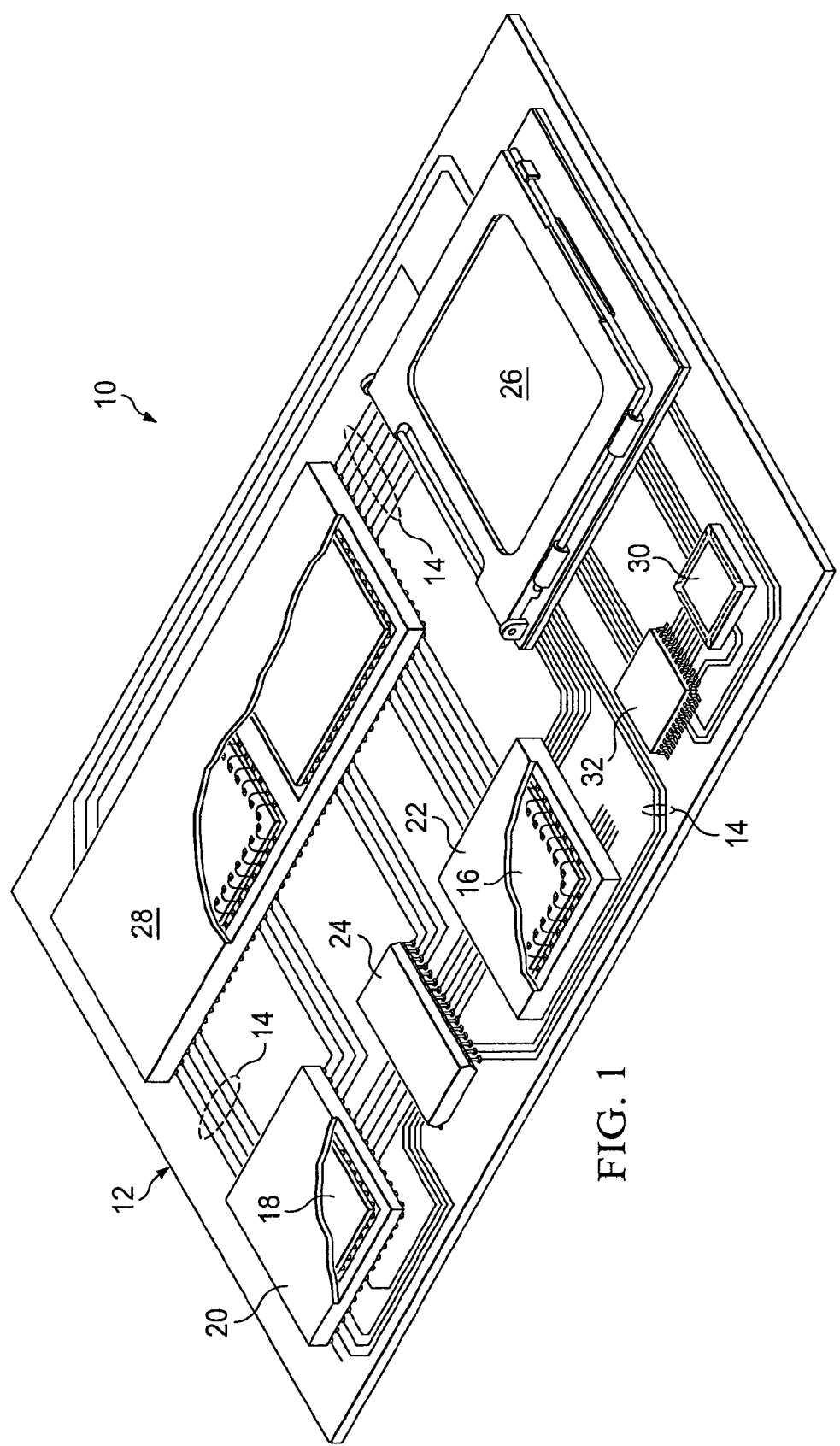
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
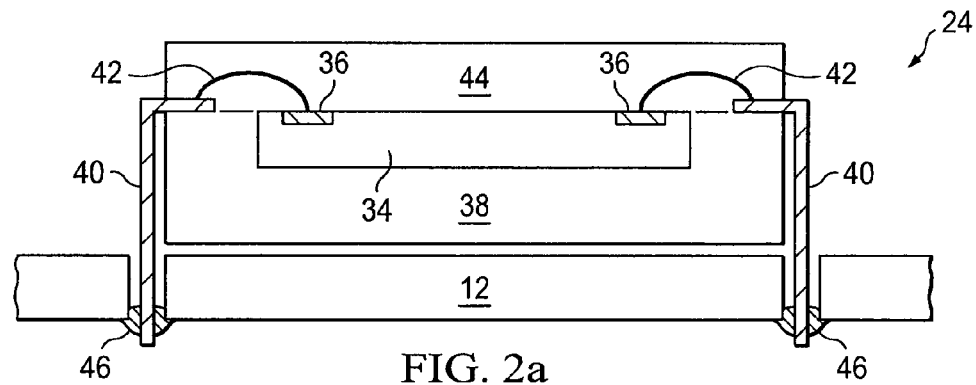
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
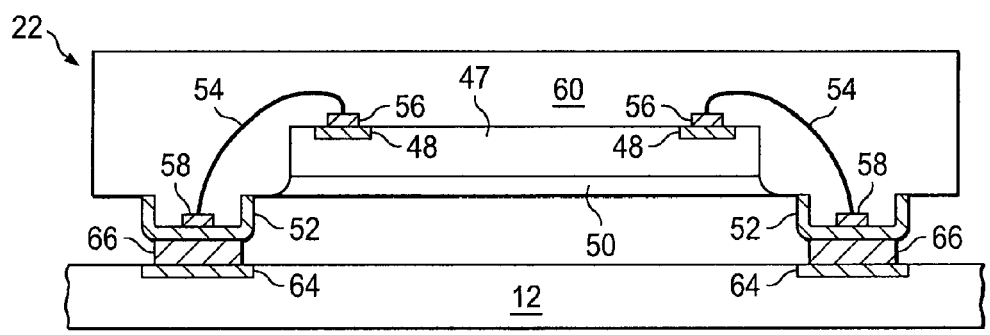

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
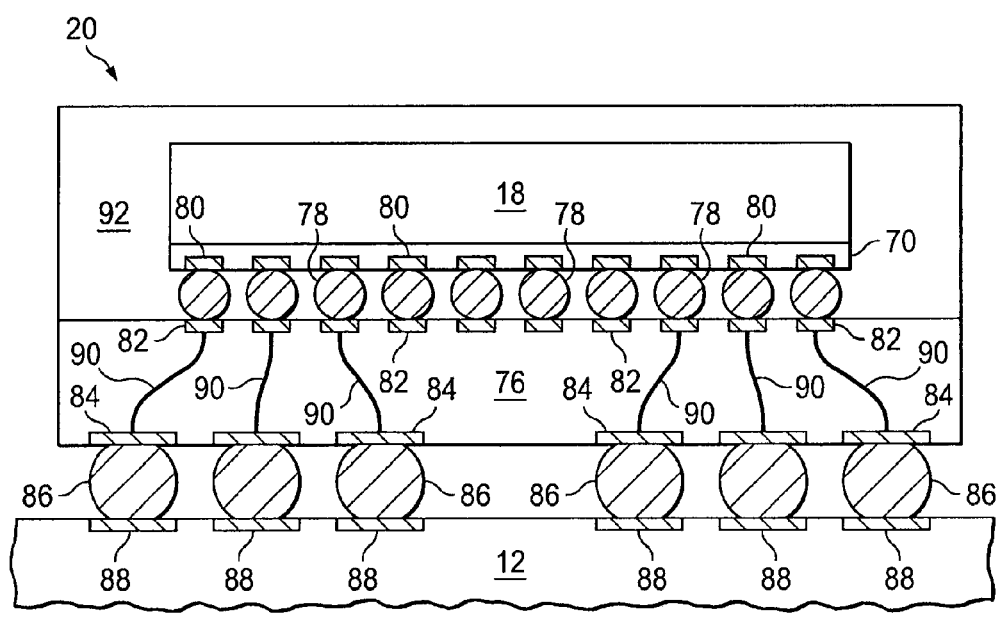

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
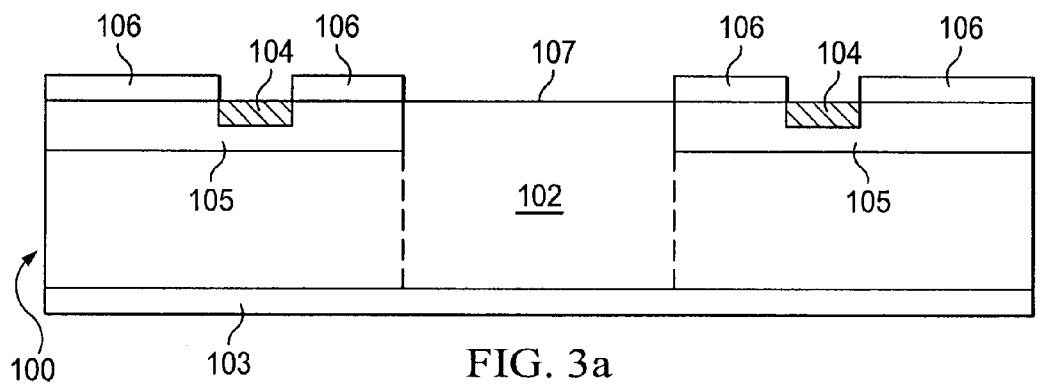

FIGS. 3a-3h illustrate a process of forming conductive pillars in a recessed region in a peripheral area around a semiconductor die. FIG. 3a illustrates a semiconductor wafer 100 made with silicon, germanium, gallium arsenide, indium phosphide, or other bulk semiconductor material 102. Wafer 100 typically ranges from 50-250 micrometers (μm) in thickness. For thick wafers, the wafer may be mounted to dicing tape 103. In the case of thin wafers, the wafer can also be mounted to a temporary carrier or substrate.

A plurality of semiconductor die is formed on wafer 100 using semiconductor manufacturing processes described above. Each semiconductor die may contain analog or digital circuits implemented as active devices, integrated passive devices (IPD), conductive layers, signal traces, and dielectric layers in active region 105. The IPDs include inductors, capacitors, and resistors. The active and passive electrical components are electrically connected to form functional electrical circuits according to the electrical design and function of the die. The semiconductor die are each separated by a peripheral area or saw street 107 as part of bulk semiconductor material 102.

An electrically conductive material, such as Al, Cu, Sn, Ni, Au, or Ag, is deposited in active region 105 using PVD, CVD, evaporation, electrolytic plating, electroless plating, screen printing, or other suitable metal deposition process to form contact pads 104. Contact pads 104 electrically connect to signal traces and other conductive layers in active region 105 according to the electrical design of the die.

A passivation layer 106 is deposited over active regions 105. Passivation layer 106 can be silicon dioxide (SiO2), silicon nitride (Si3N4), silicon oxynitride (SiON), tantalum pentoxide (Ta2O5), aluminum oxide (Al2O3), polyimide (PI), benzocyclobutene (BCB), polybenzoxazole (PBO), or other suitable material having insulating properties. A portion of passivation layer 106 is removed by an etching process to expose contact pads 104. Saw street 107 is about 90 μm in width to provide separation between the semiconductor die on wafer 100 for formation of conductive pillars and dicing operations as described below.

Figure 3B:
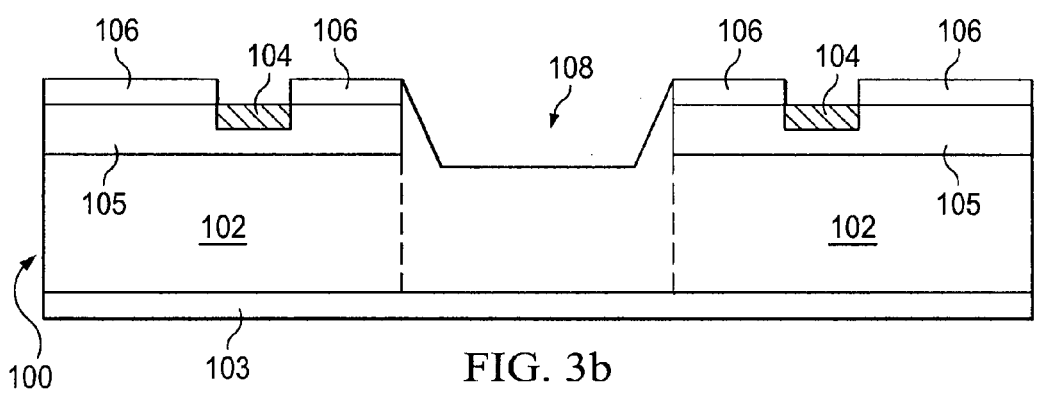

In FIG. 3b, a trench or recessed region 108 is formed in saw street 107 by chemical etching, mechanical cutting, or laser cutting. In one embodiment, recessed region 108 has sidewalls which are angled to 45 degrees with respect to the horizontal surface of wafer 100. Alternatively, the sidewalls of recessed region 108 can be vertical. The width of recessed region 108 is about 50-100 micrometers (μm). The depth of recessed region 108 ranges from 25 to 100 μm. FIG. 3c shows a top view of an intersection of recessed regions 108 separating active regions 105 of four semiconductor die. Each semiconductor die active region 105 is covered by passivation layer 106 and contains contact pads 104.

Figure 3D:
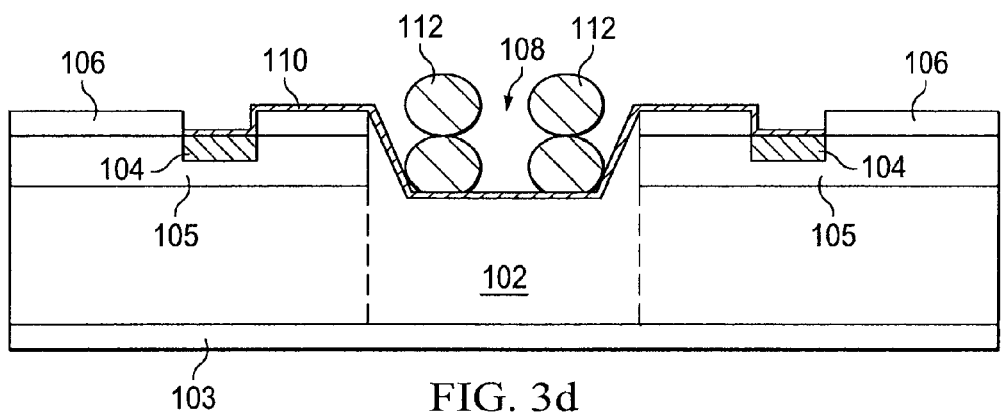
Figure 3C:
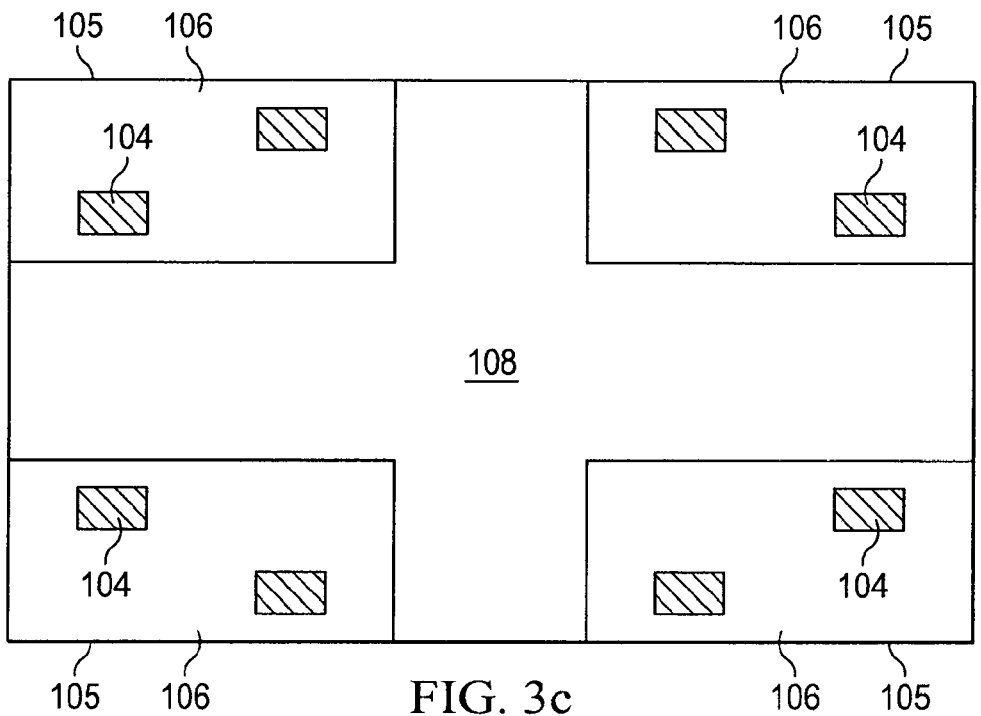

In FIG. 3d, an electrically conductive layer 110 is patterned and deposited over passivation layer 106, contact pads 104, and further into recessed region 108 using PVD, CVD, evaporation, electrolytic plating, electroless plating, screen printing, or other suitable metal deposition process. The conductive layer 110 can be Al, Cu, Sn, Ni, Au, Ag, or other suitable material. Conductive layer 110 electrically connects to contact pads 104 to form signal traces or redistribution layers (RDL). The conformal application of conductive layer 110 follows the contour of insulating layer 106 and recessed region 108. As a result, RDL 110 steps down from passivation layer 106 into recessed region 108.

Conductive pillars or posts 112 are formed in recessed region 108 over RDL 110. Conductive pillars 112 can be Cu, Al, W, Au, solder, or other suitable electrically conductive material. To form conductive pillars, conductive bumps made of conductive material such as Au are vertically stacked over one another. Each bump can be about 30 μm in diameter. The stacked bumps in recessed region 108 can be formed using wire bond techniques. Conductive pillars 112 extend above the portion of RDL 110 which is outside recessed region 108. Saw street 107 is made sufficiently wide to form two side-by-side conductive pillars 112, which will provide one full conductive pillar for each semiconductor die following later dicing operation.

Figure 10:
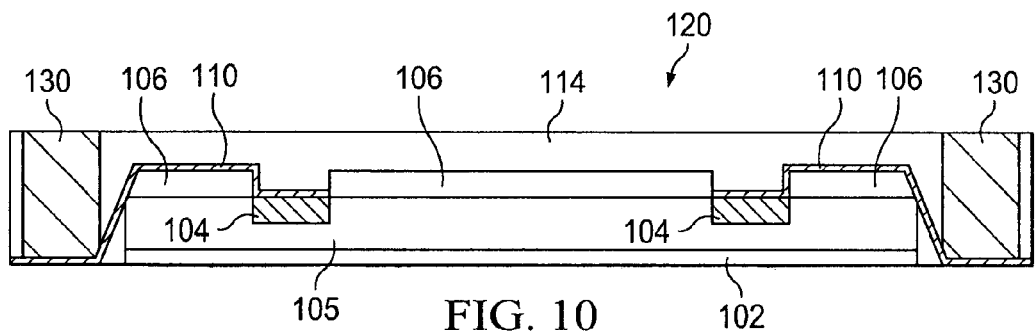
FIG. 10 illustrates the conductive pillars formed as columns.

In another embodiment, a thick layer of photoresist is deposited over RDL 110. The photoresist can be a liquid or a dry film. Two layers of photoresist may be applied to achieve the desired thickness. The photoresist is patterned and metal is deposited in the patterned areas of the photoresist using PVD, CVD, electrolytic plating, or electroless plating process. The photoresist is stripped away leaving behind individual conductive pillars 112, as shown in FIG. 10.

Figure 3E:
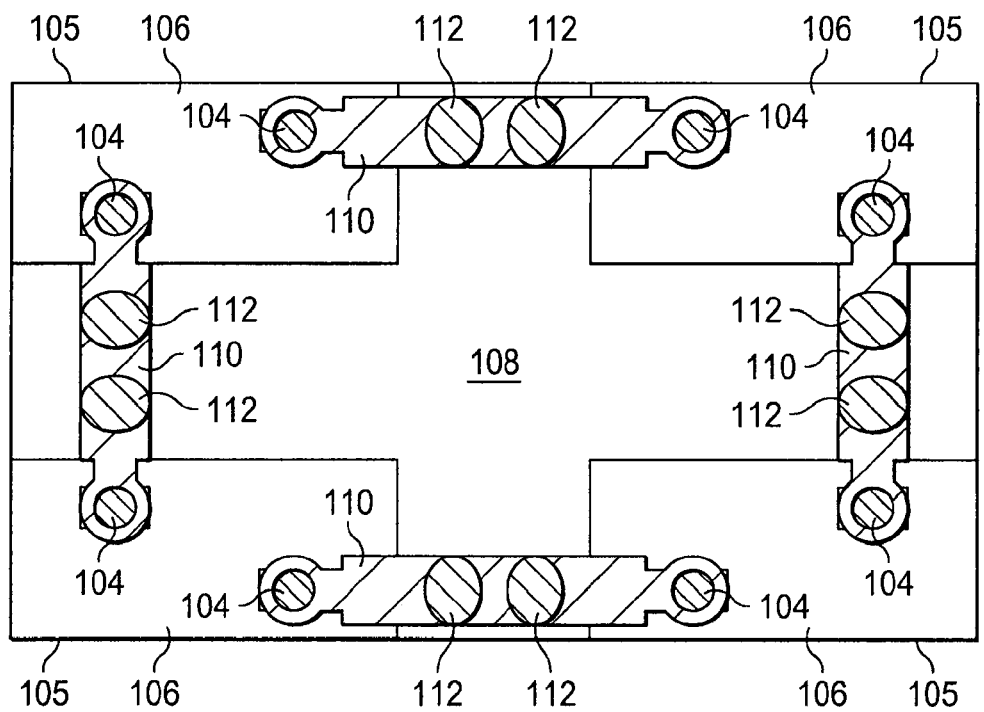

FIG. 3e is a top view of RDL 110 electrically interconnecting to contact pads 104 in active region 105. Conductive pillars 112 are formed on RDL 110 in recessed regions 108 and electrically connect to contact pads 104 in active regions 105.

Figure 3F:
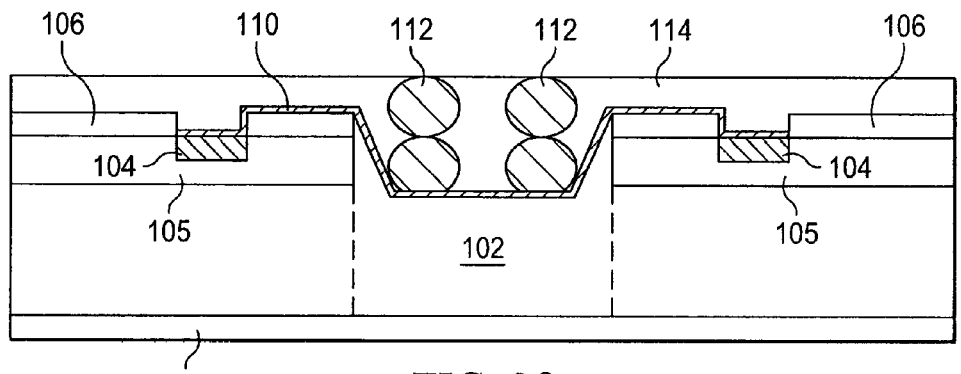

In FIG. 3f, an insulating layer 114 is formed over passivation layer 106, RDL 110, and conductive pillars 112. The insulating layer 114 can be Si3N4, SiO2, SiON, Ta2O5, zinc oxide (ZnO), zircon (ZrO2), Al2O3, or other suitable dielectric material. The deposition of insulating layer 114 may involve lamination, spin coating, PVD, or CVD. Alternatively, an encapsulant or molding compound can be dispensed to encapsulate and provide environmental protection from external elements and contaminants. The encapsulant can be epoxy resin, epoxy acrylate, polymer, or polymer composite material. A portion of insulating layer 114 may be removed by grinding, CMP, or dry etching to expose conductive pillars 112.

Figure 3G:
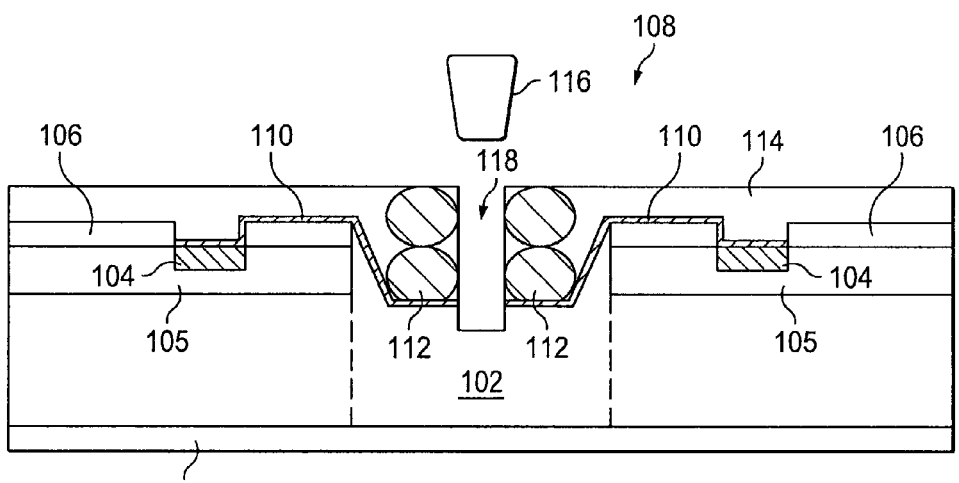

Wafer 100 undergoes partial dicing operation with saw blade or laser tool 116 to cut dicing channel 118 through saw street 107 between conductive pillars 112, as shown in FIG. 3g. Dicing channel 118 extends through recessed region 108 and RDL 110 and partially into wafer base material 102. In this embodiment, dicing channel 118 does not extend completely through wafer base material 102. The width of dicing channel 118 is about 10-15 μm. FIG. 3h shows a top view of dicing channel 118 separating active regions 105 of the semiconductor die after the partial dicing step.

Figure 4A:
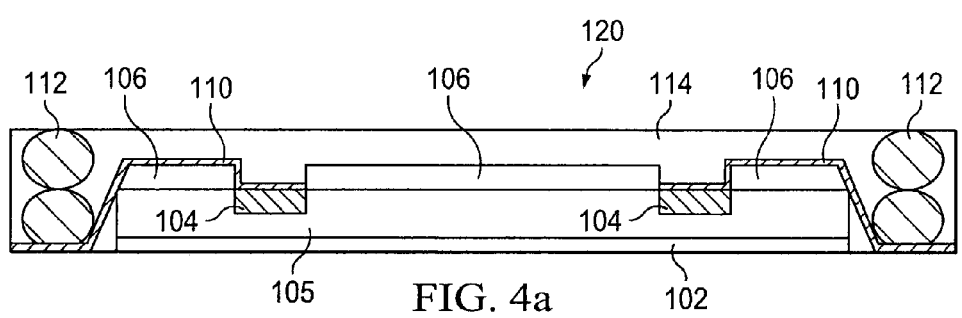

Wafer 100 undergoes backgrinding to remove dicing tape 103 and a portion of bulk material 102 from a backside of wafer 100, opposite active region 105, least up to dicing channel 118. Plasma etching, CMP, wet etch, dry etch, or other wafer thinning process can also be used to remove the wafer bulk material. By backgrinding to dicing channel 118, wafer 100 is singulated into individual semiconductor devices 120, as shown in FIG. 4a. The partial dicing followed by backgrinding to singulate wafer 100 eliminates the need for a thin wafer handler.

Each semiconductor device 120 has conductive pillars 112 electrically connected through RDL 110 to contact pads 104 of active regions 105. FIG. 4b is a top view of semiconductor device 120 with conductive pillars 112 exposed from insulating layer 114. The exposed conductive pillars provides vertical electrical interconnection to other components in a package-in-package (PiP), package-on-package (PoP), or fan-in package on package (FiPoP) configuration.

Figure 5:
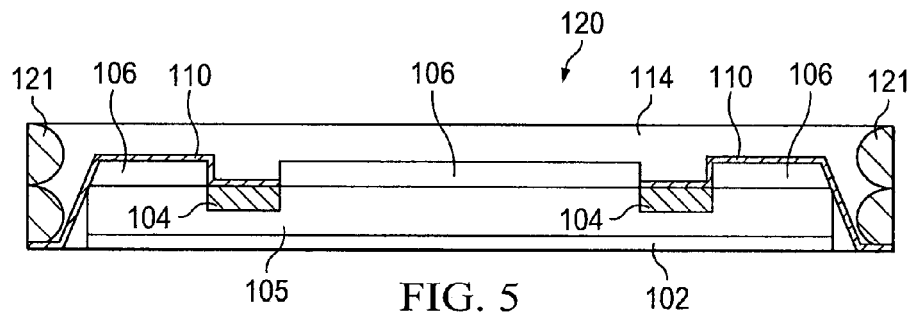
FIG. 5 illustrates the semiconductor device with half conductive pillars formed in the recessed region of the peripheral area around the die.

In FIG. 5, semiconductor device 120 is shown with half-conductive pillars 121. In this case, one conductive pillar is formed in saw street 107, as opposed to the two conductive pillars as described in FIG. 3d. The partial dicing operation cuts through the single conductive pillar to form two half conductive pillars 121.

Figure 6:
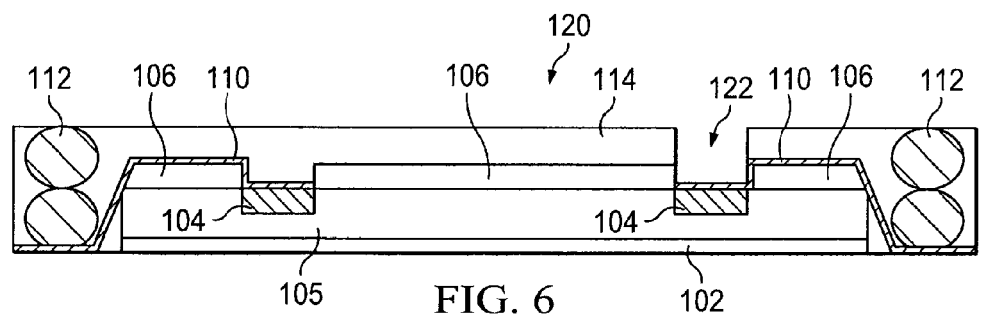
FIG. 6 illustrates the semiconductor device with a portion of the top insulating layer removed to expose the contact pad of the die.

An opening 122 is formed in insulating layer 114 over contact pad 104 in FIG. 6. The opening 122 provides access to contact pad 104 for testing purposes.

Figure 7:
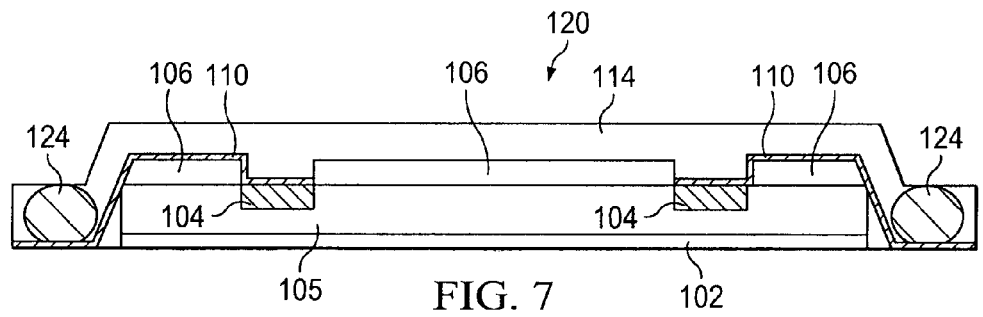
FIG. 7 illustrates the semiconductor device with a portion of the top insulating layer removed to expose the conductive pillars.

In FIG. 7, conductive pillars 124 are formed on RDL 110. The height of conductive pillars 124 is made about the same height as RDL 110 outside recessed region 108. A portion of insulating layer 114 over conductive pillars 124 is removed or dented using saw blade or laser cutting tool. The lower height of conductive pillars 124, as compared to FIG. 3d, reduces total stacked package height. The lower height of conductive pillars 124 requires few stacked bumps, which reduces manufacturing cost.

Figure 8:
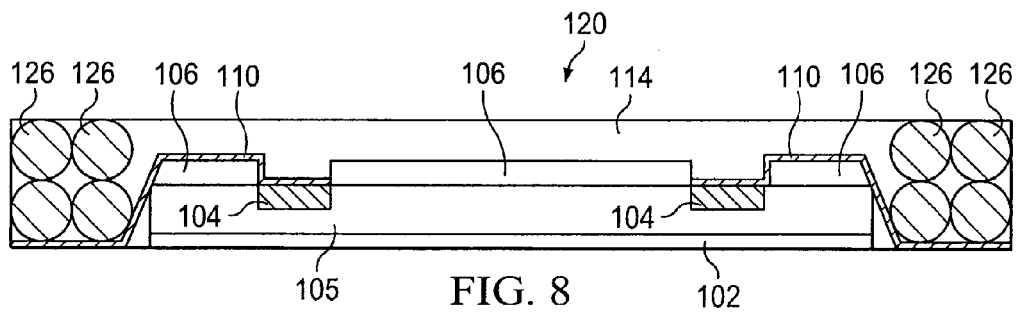
FIG. 8 illustrates the semiconductor device with multiple rows of conductive pillars formed in the recessed region of peripheral area around the die.

FIG. 8 illustrates multiple rows of conductive pillars 126 for higher input/output (I/O) pin count for semiconductor device 120. The multiple rows of conductive pillars 126 are formed as described in FIG. 3d. The partial dicing operation cuts between the multiple rows of conductive pillars 126.

Figure 9:
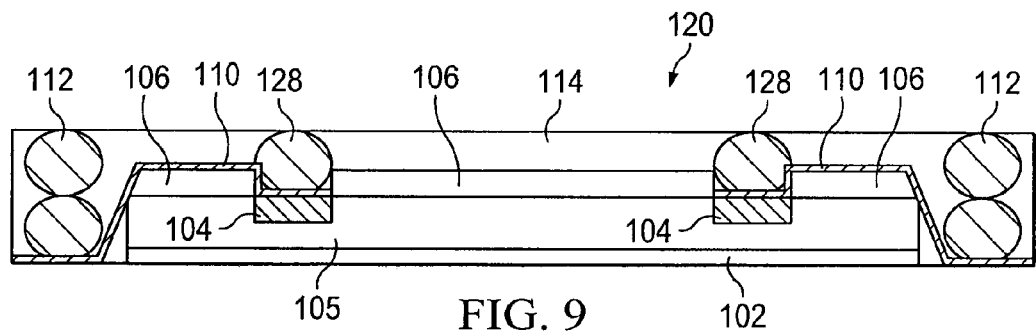
FIG. 9 illustrates a conductive bump formed over the contact pad of the die.

FIG. 9 shows conductive bumps 128 formed over RDL 110 and contact pads 104, in the non-recessed area of semiconductor device 120. A portion of insulating layer 114 is removed in order to form conductive bumps 128. Conductive bumps 128 provide for higher I/O pin count for semiconductor device 120.

Conductive pillars 112 can be implemented in a variety of forms as discussed with reference to FIG. 3d. Another example is shown in FIG. 10 with conductive pillars 130 formed as a column of conductive material, such as Cu.

Figure 11:
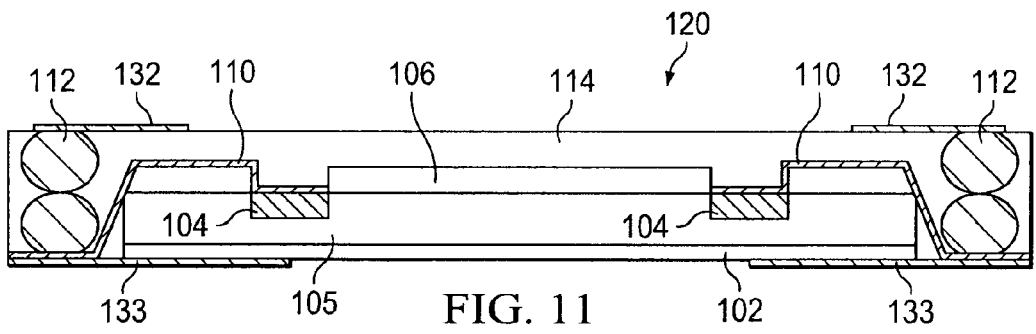
FIG. 11 illustrates a second conductive layer formed over the top insulating layer and electrically connected to the conductive pillar.

In FIG. 11, a top-side RDL 132 is placed over insulating layer 114. A bottom-side RDL 133 is placed over bulk semiconductor material 102. RDLs 132 and 133 electrically connect through conductive pillars 112 and RDL 110 to contact pads 104 in active regions 105.

Figure 12:
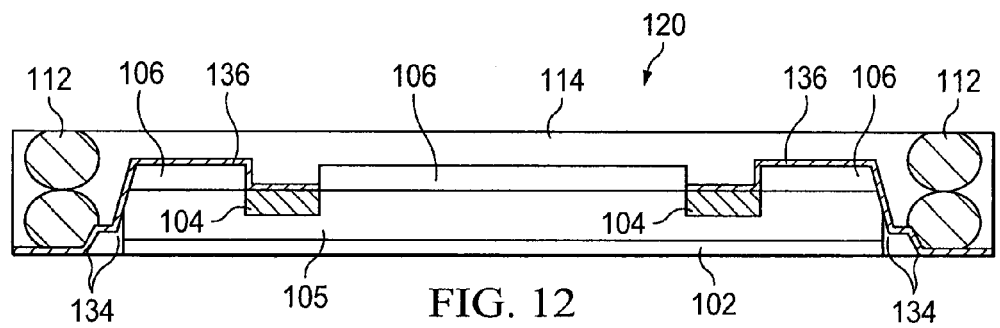
FIG. 12 illustrates the recessed region of the peripheral area with multiple steps.

FIG. 12 shows the sidewalls of recessed region 108 having multiple steps 134. RDL 136 conforms to the multi-step sidewall to electrically connect conductive pillars 112 to contact pads 104 in active region 105.

Figure 13:
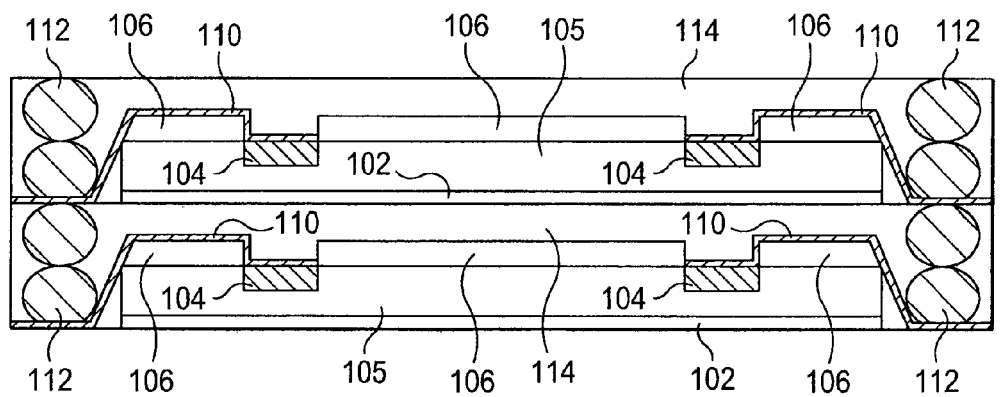
FIG. 13 illustrates two stacked semiconductor devices electrically interconnected through the conductive pillars.

FIG. 13 shows two stacked semiconductor devices 120 from FIG. 4a. The stacked semiconductor devices 120 are electrically interconnected through RDLs 110 and conductive pillars 112.

Figure 14:
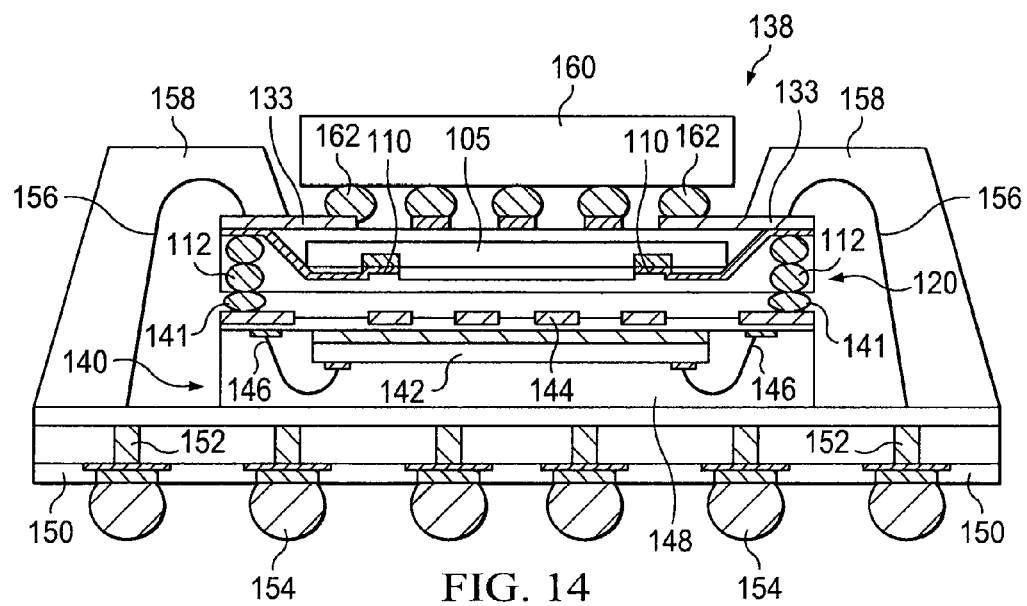
FIG. 14 illustrates a FiPoP package with components interconnected through the conductive pillars.

The aforedescribed semiconductor die 120 with conductive pillars 112 can be readily integrated into FiPoP 138, as shown in FIG. 14. Semiconductor device 120 with bottom-side RDL 133 from FIG. 11 is mounted to semiconductor device 140 by way of solder bumps 141. Semiconductor device 140 includes semiconductor die 142 electrically connected to interconnect structure 144 through wire bonds 146. An encapsulant 148 covers semiconductor die 142. Semiconductor device 140 is mounted to substrate 150 which has an interconnect structure 152 and solder bumps 154 for electrical interconnect to external devices. The bottom-side RDL 133 is electrically connected to interconnect structure 152 through wire bonds 156. A molding compound or encapsulant 158 is deposited over semiconductor devices 120 and 140 using dedicated mold chase design. Encapsulant 158 can be made with epoxy acrylate or other polymer material and applied by transfer molding, liquid encapsulant molding, or other molding process. Encapsulant 158 is non-conductive and environmentally protects the semiconductor device from external elements and contaminants.

The stacked semiconductor devices 120, 140, and 160 are electrically interconnected through conductive pillars 112. For example, semiconductor die 160 is electrically connected through solder bumps 162, RDL 133, conductive pillars 112, and RDL 110 to contacts pads in active region 105. Likewise, semiconductor devices 120 and 140 electrically connect through interconnect structure 144, wire bonds 146, solder bumps 141, RDL 110, conductive pillars 112, RDL 133, and wire bonds 156 to interconnect structure 152.

Figure 15:
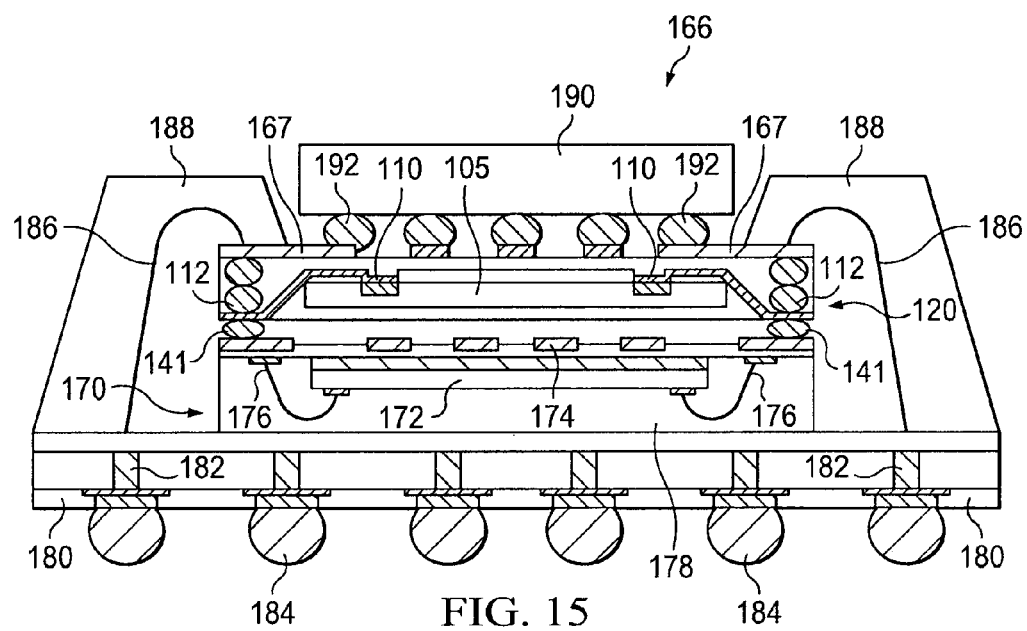
FIG. 15 illustrates another FiPoP package with components interconnected through the conductive pillars.

The aforedescribed semiconductor die 120 with conductive pillars 112 can also be integrated into FiPoP 166, as shown in FIG. 15. Semiconductor device 120 with top-side RDL 167 is mounted to semiconductor device 170 by way of solder bumps 171. Semiconductor device 170 includes semiconductor die 172 electrically connected to interconnect structure 174 through wire bonds 176. An encapsulant 178 covers semiconductor die 172. Semiconductor device 170 is mounted to substrate 180 which has an interconnect structure 182 and solder bumps 184 for electrical interconnect to external devices. The top-side RDL 167 is electrically connected to interconnect structure 182 through wire bonds 186. A molding compound or encapsulant 188 is deposited over semiconductor devices 120 and 170 using dedicated mold chase design. Encapsulant 188 can be made with epoxy acrylate or other polymer material and applied by transfer molding, liquid encapsulant molding, or other molding process. Encapsulant 188 is non-conductive and environmentally protects the semiconductor device from external elements and contaminants.

The stacked semiconductor devices 120, 170, and 190 are electrically interconnected through conductive pillars 112. For example, semiconductor die 190 is electrically connected through solder bumps 192, RDL 167, conductive pillars 112, and RDL 110 to contacts pads in active region 105. Likewise, semiconductor devices 120 and 170 electrically connect through interconnect structure 174, wire bonds 176, solder bumps 171, RDL 110, conductive pillars 112, RDL 167, and wire bonds 186 to interconnect structure 182.

The interconnect structure of semiconductor device 120, including conductive pillars 112, can also be integrated into PiP and PoP arrangements.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
    a semiconductor wafer having a plurality of semiconductor die with a recessed region formed in a peripheral area around the semiconductor die;
    a first insulating layer formed over the semiconductor die;
    a first conductive layer formed over the first insulating layer outside the recessed region and further extending into the recessed region, the first conductive layer being electrically connected to a contact pad on the semiconductor die;
    a conductive pillar formed over the first conductive layer within the recessed region, the conductive pillar extending above a portion of the first conductive layer outside the peripheral area; and
    a second insulating layer formed over the first insulating layer, conductive pillar, and first conductive layer such that the conductive pillar is exposed from the second insulating layer.

2. The semiconductor device of claim 1, further including a dicing channel formed partially through the peripheral area, wherein a portion of a backside of the semiconductor wafer is removed to the dicing channel to singulate the semiconductor wafer and separate the semiconductor die.

3. The semiconductor device of claim 1, further including a plurality of conductive pillars formed in the recessed region, wherein the dicing channel is formed between the conductive pillars.

4. The semiconductor device of claim 1, wherein the dicing channel is formed through the conductive pillar.

5. The semiconductor device of claim 1, further including a second conductive layer formed over the second insulating layer and electrically connected to the conductive pillar.

6. The semiconductor device of claim 1, wherein the recessed region has an angled or vertical sidewall.

7. A semiconductor device, comprising:
    a semiconductor wafer having a plurality of semiconductor die with a recessed region formed in a peripheral area around the semiconductor die;
    a first insulating layer formed over the semiconductor wafer;
    a first conductive layer formed over the first insulating layer outside the recessed region and further extending into the recessed region;
    a conductive pillar formed over the first conductive layer within the recessed region; and
    a second insulating layer formed over the conductive pillar and first conductive layer.

8. The semiconductor device of claim 7, wherein the semiconductor wafer is singulated through the peripheral area to separate the semiconductor die.

9. The semiconductor device of claim 7, wherein the recessed region has an angled or vertical sidewall.

10. The semiconductor device of claim 7, wherein the conductive pillar includes stacked bumps.

11. The semiconductor device of claim 7, wherein a portion of the second insulating layer is removed to expose the conductive pillar.

12. The semiconductor device of claim 7, wherein the semiconductor wafer includes a dicing channel formed partially through the peripheral area, wherein a portion of a backside of the semiconductor wafer is removed to the dicing channel to singulate the semiconductor wafer and separate the semiconductor die.

13. The semiconductor device of claim 7, further including a second conductive layer formed over the second insulating layer and electrically connected to the conductive pillar.

14. A semiconductor device, comprising:
    a semiconductor wafer having a plurality of semiconductor die with a peripheral area around the semiconductor die;
    a recessed region formed in the peripheral area;
    a first conductive layer formed in the recessed region;
    a conductive pillar formed over the first conductive layer within the recessed region; and
    an insulating layer formed over the conductive pillar and first conductive layer, wherein the semiconductor wafer is singulated through the peripheral area to separate the semiconductor die.

15. The semiconductor device of claim 14, wherein the recessed region has an angled or vertical sidewall.

16. The semiconductor device of claim 14, wherein the first conductive layer is formed over the semiconductor die outside the peripheral area.

17. The semiconductor device of claim 14, wherein the conductive pillar includes stacked bumps.

18. The semiconductor device of claim 14, further including a second conductive layer formed over the insulating layer and electrically connected to the conductive pillar.

19. The semiconductor device of claim 14, wherein a portion of the insulating layer is removed to expose the conductive pillar.

20. The semiconductor device of claim 14, further including a plurality of conductive pillars formed in the recessed region, wherein the dicing channel is formed between the conductive pillars.

21. A semiconductor device, comprising:
    a semiconductor die having a recessed region formed in a peripheral area of the semiconductor die;
    a first conductive layer formed in the recessed region;
    a conductive pillar formed over the first conductive layer within the recessed region; and
    an insulating layer formed over the conductive pillar and first conductive layer.

22. The semiconductor device of claim 21, wherein the recessed region has an angled or vertical sidewall.

23. The semiconductor device of claim 21, wherein the first conductive layer is formed over the semiconductor die outside the peripheral area.

24. The semiconductor device of claim 21, wherein a portion of the insulating layer is removed to expose the conductive pillar.

25. The semiconductor device of claim 21, further including a second conductive layer formed over the insulating layer and electrically connected to the conductive pillar.

\* \* \* \* \*